US006969874B1

(12) United States Patent
Gee et al.

(10) Patent No.: US 6,969,874 B1
(45) Date of Patent: Nov. 29, 2005

(54) FLIP-CHIP LIGHT EMITTING DIODE WITH RESONANT OPTICAL MICROCAVITY

(75) Inventors: James M. Gee, Albuquerque, NM (US); Katherine H. A. Bogart, Corrales, NM (US); Arthur J. Fischer, Sandia Park, NM (US)

(73) Assignee: Sandia Corporation, Albuquerque, NM (US)

( * ) Notice: Subject to any disclaimer, the term of this patent is extended or adjusted under 35 U.S.C. 154(b) by 48 days.

(21) Appl. No.: 10/459,965

(22) Filed: Jun. 12, 2003

(51) Int. Cl.[7] .......................................... H01L 33/00
(52) U.S. Cl. ........................... 257/98; 257/94; 257/99
(58) Field of Search .................... 257/79–103; 438/27, 438/29

(56) References Cited

U.S. PATENT DOCUMENTS

| | | | |
|---|---|---|---|
| 5,068,868 A | 11/1991 | Deppe et al. | 37/4 |
| 5,226,053 A | 7/1993 | Cho et al. | 372/45 |
| 5,362,977 A | 11/1994 | Hunt et al. | 257/98 |
| 5,862,167 A | 1/1999 | Sassa et al. | 372/45 |
| 6,438,149 B1 | 8/2002 | Tayebati et al. | 372/45 |
| 6,455,340 B1 * | 9/2002 | Chua et al. | 438/31 |
| 6,455,878 B1 | 9/2002 | Bhat et al. | 257/99 |
| 6,462,358 B1 | 10/2002 | Lin et al. | 257/99 |
| 6,483,196 B1 | 11/2002 | Wojnarowski et al. | 257/778 |
| 2001/0002048 A1 * | 5/2001 | Koike et al. | 257/80 |
| 2002/0014630 A1 * | 2/2002 | Okazaki et al. | 257/79 |
| 2003/0086467 A1 * | 5/2003 | Modak et al. | 372/96 |
| 2003/0209714 A1 * | 11/2003 | Taskar et al. | 257/79 |

OTHER PUBLICATIONS

J. J. Wierer, et al, "High-Power AlGaInN flip-chip light-emiting diodes", May 28, 2001, pp. 3378-3881.
Shen, et al, "Optical cavity effects in InGaN/GaN quantum-well-heterostructure flip-chip light-emitting diodes", Apr. 7, 2003, pp. 2221-2223.
Waldrip, et al., "Stress Engineering During Metalorganic Chemical Vapor Deposition o AlGaN/GaN distributed Bragg Reflectors", May 21, 2002, pp. 3205-3207.
Schubert, et al, "Resonant Cavity Light-Emitting Diode", Dec. 16, 1991, pp. 921-923.
V. Adivarahan, et al, "Indium-Silicon Co-Doping of High-Aluminum-Content AiGaN for Solar Blind Photodetectors", Sep. 17, 2001, pp. 1903-1905.
Benistry, et al, "Impact of Planar Microcavity Effects on Light Extraction—Part I: Basic Concepts and Analytical Trends", Sep. 1988, pp. 1612-1631.
Benistry, et al, "Impact of Planar Microcavity Effects on Light Extraction—Part II: Selected Exact Simulations and Role of Photon Recycling", Sep. 1998, pp. 1632-1643.

* cited by examiner

Primary Examiner—Shouxiang Hu

(74) Attorney, Agent, or Firm—Robert D. Watson

(57) ABSTRACT

A flip-chip light emitting diode with enhanced efficiency. The device structure employs a microcavity structure in a flip-chip configuration. The microcavity enhances the light emission in vertical modes, which are readily extracted from the device. Most of the rest of the light is emitted into waveguided lateral modes. Flip-chip configuration is advantageous for light emitting diodes (LEDs) grown on dielectric substrates (e.g., gallium nitride LEDs grown on sapphire substrates) in general due to better thermal dissipation and lower series resistance. Flip-chip configuration is advantageous for microcavity LEDs in particular because (a) one of the reflectors is a high-reflectivity metal ohmic contact that is already part of the flip-chip configuration, and (b) current conduction is only required through a single distributed Bragg reflector. Some of the waveguided lateral modes can also be extracted with angled sidewalls used for the interdigitated contacts in the flip-chip configuration.

14 Claims, 2 Drawing Sheets

FLIP-CHIP LIGHT EMITTING DIODE WITH RESONANT OPTICAL MICROCAVITY

FEDERALLY SPONSORED RESEARCH

The United States Government has rights in this invention pursuant to Department of Energy Contract No. DE-AC04-94AL85000 with Sandia Corporation.

BACKGROUND OF THE INVENTION

The present invention relates generally to a light emitting diode (LED), and more specifically to a flip-chip light emitting diode with resonant microcavity for enhanced light extraction efficiency.

A light emitting diode (LED) is a semiconductor device that generates light from electrical excitation. It would be advantageous for many applications to improve the efficiency (radiant power out divided by electrical power in) of LEDs. One of the primary limitations to nitride LED performance is extracting light from the semiconductor. The problem is that semiconductors generally have large refractive indices (n). The large refractive index causes most of the light to be internally reflected at the front surface due to total internal reflection, with the net result that only around 5% of the light can escape in LEDs using typical III-V semiconductor alloys.

One method for improving the light extraction from an LED is to use a microcavity LED, which is also known as a resonant-cavity LED. These LEDs place the light emission layer inside a Fabry-Perot cavity having dimensions selected to create a resonance tuned to the emission wavelength of the LED. Use of a resonant microcavity increases the light emission into the vertical modes (which are more easily extracted) by reducing the total number of optical modes in the device. The rest of the light is emitted into waveguided modes that travel lateral to the surface of the LED. Representative patents describing resonant-cavity LEDs include U.S. Pat. No. 6,438,149 to Tayebati, et al; U.S. Pat. No. 5,068,868 to Deppe, et al.; U.S. Pat. No. 5,226,053 to Cho, et al.; and U.S. Pat. No. 5,362,977 to Hunt, et al.

Using a thin microcavity minimizes losses due to waveguided light; the thickness need be only a few wavelengths. Extraction efficiencies on the order of 30% to 50% for semiconductors of interest have been predicted. One of the microcavity reflectors (e.g., rear reflector) generally has a very high reflectivity (>95%); while the other microcavity reflector (e.g., front reflector) is partially reflecting, and can have a reflectivity as low as 25%. In addition to optimization of the cavity's reflectors, the light extraction efficiency is maximized by placing the light-emitting active layer (i.e., emissive layer) at an anti-node of the cavity. The electric field is a maximum at the anti-node, so the emitted light couples most strongly into the optical mode when placed at the anti-node.

LEDs with optical resonant microcavities typically use distributed Bragg reflectors (DBRs) for the front and rear reflectors. Distributed Bragg reflectors typically consist of a stack of alternating semiconductor materials with different refractive indices and quarter-wavelength thickness. A larger number of layers are required to achieve high reflectivity if the difference in refractive indices is small. A larger number of layers could increase electrical resistance losses due to the large number of interfaces or if some of the layers are difficult to dope. Also, it might be difficult to maintain material quality with a larger number of layers—particularly if the layers do not have the same lattice constant. Distributed Bragg reflectors are particularly difficult to fabricate for alloys of aluminum-indium-gallium-nitride (AlInGaN), because the Al-alloys are difficult to dope (p-type is more difficult than n-type), and because there is a large lattice mismatch between AlGaN and GaN compounds.

LEDs using InGaN alloys for the emissive layer emit in the violet to the green wavelengths, which are very useful for a variety of display, signaling, and illumination applications. LEDs using AlInGaN alloys for the emissive layer emit in ultraviolet wavelengths (about 240 to 400 nm), which are useful for a wide variety of applications (e.g., sensors, communication, etc.) When the emissive material is grown on a substrate that is electrically insulating (e.g., sapphire), both p and n-contacts are located on the epitaxial (i.e., front) surface. Consequently, front-surface emitting LEDs (e.g., AlInGaN LEDs) have reduced light extraction due to the parasitic absorption by the metal contacts, bond pads, and wire bonds to the submount or device package.

Flip-chip configuration refers to flipping the chip upside down so that light is now emitted through a transparent growth substrate (e.g., sapphire), as illustrated schematically in FIGS. 1 and 2. A flip-chip configuration has a number of advantages over the standard configuration where light is emitted from the GaN surface (i.e., "front-surface emission" configuration). Firstly, it has superior thermal dissipation compared to the conventional front-surface emission design because heat is no longer conducted through the sapphire growth substrate (sapphire has a much lower thermal conductivity compared to the ceramic or silicon substrates typically used for the submount), but, rather, is conducted directly to the submount through high thermal conductivity metallic contact pads and interconnects. Secondly, the flip-chip geometry has lower series resistance compared to a front-emission geometry because a thicker metal p-contact pad can be used as a current spreader (front-surface emission requires an optically-transparent p-contact pad to transmit the light, which requires a very thin metal layer). The lower series resistance also means that the LED can be made larger for higher total flux. Another advantage of the flip-chip configuration is the fact that the rear metal p-contact pad (depending on the choice of metal or metal alloy) can also function as a reflector (i.e., mirror), which increases the total light output by reflecting light initially emitted from the light emitting layer (e.g., MQW in FIGS. 1 and 2) towards the rear p-contact back towards the sapphire substrate, where it passes through and escapes.

Conventional flip-chip LED's, such as those illustrated in FIGS. 1 and 2, do not utilize resonant microcavities to enhance light extraction efficiency. Representative patents describing flip-chip LEDs include U.S. Pat. No. 6,455,878 to Bhat, et al.; and 6,483,196 to Wojnarowski, et al.

What is needed, therefore, is an improved LED design that combines the beneficial features of a flip-chip configuration with the enhanced light extraction efficiency of a resonant optical microcavity.

Against this background, the present invention was developed.

SUMMARY OF THE INVENTION

The present invention relates to a flip-chip light emitting diode with enhanced efficiency. The device structure employs a microcavity structure in a flip-chip configuration. The microcavity enhances the light emission in vertical modes, which are readily extracted from the device. Most of the rest of the light is emitted into waveguided lateral modes.

Flip-chip configuration is advantageous for light emitting diodes (LEDs) grown on dielectric substrates (e.g., gallium nitride LEDs grown on, sapphire substrates) in general due to better thermal dissipation and lower series resistance. Flip-chip configuration is advantageous for microcavity LEDs in particular because (a) one of the reflectors is a high-reflectivity metal ohmic contact that is already part of the flip-chip configuration, and (b) current conduction is only required through a single distributed Bragg reflector. Some of the waveguided lateral modes can also be extracted with angled sidewalls used for the interdigitated contacts in the flip-chip configuration.

BRIEF DESCRIPTION OF THE DRAWINGS

The accompanying drawings, which are incorporated in and form part of the specification, illustrate various examples of the present invention and, together with the detailed description, serve to explain the principles of the invention.

DETAILED DESCRIPTION OF THE INVENTION

Figure 1:
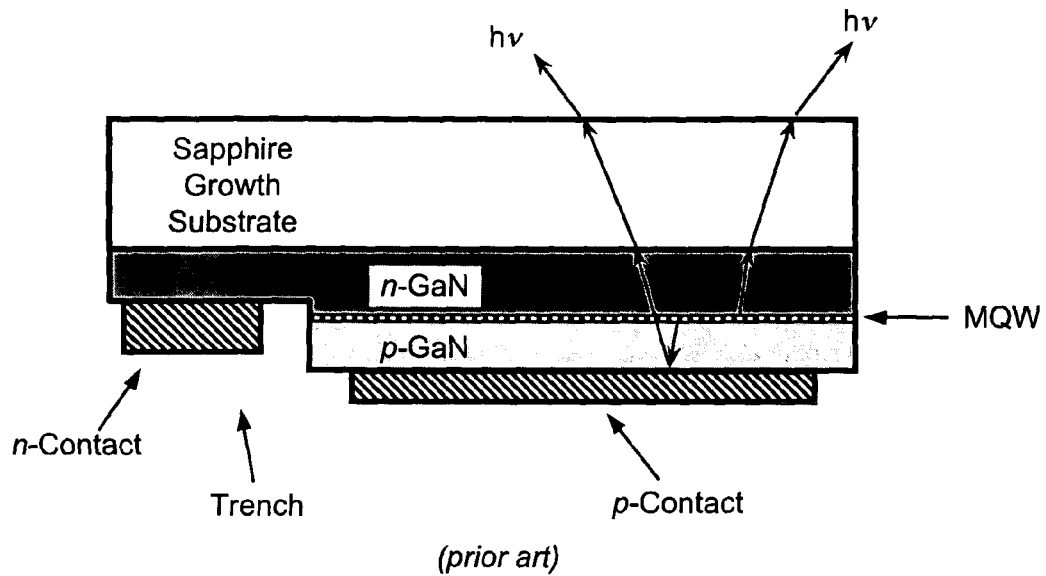
FIG. 1 shows a schematic cross-section view of a conventional flip-chip LED without a resonant microcavity.
Figure 2:
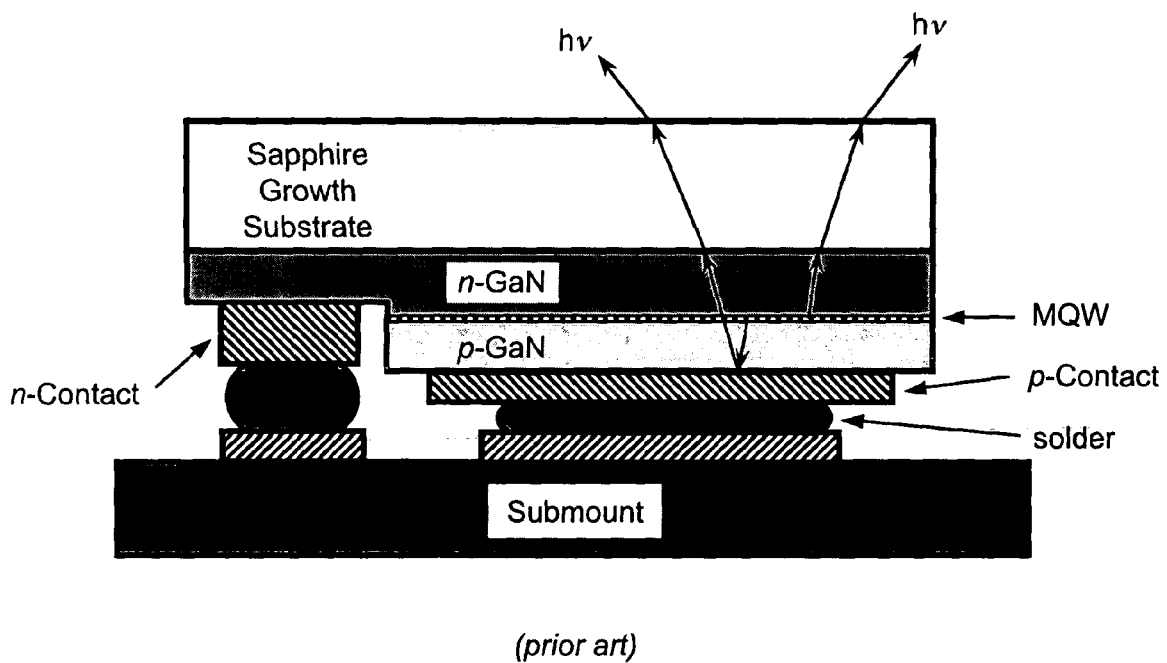
FIG. 2 shows a schematic cross-section view of a conventional flip-chip LED without a resonant microcavity that is mounted and electrically interconnected to a submount.

Note that in the drawings, the thicknesses of the various layers of insulating, semiconductor, and metallic materials; and other dimensions, such as the width of contact pads, are not drawn to scale, but, rather, are shown schematically for purposes of illustration and easy identification.

Figure 3:
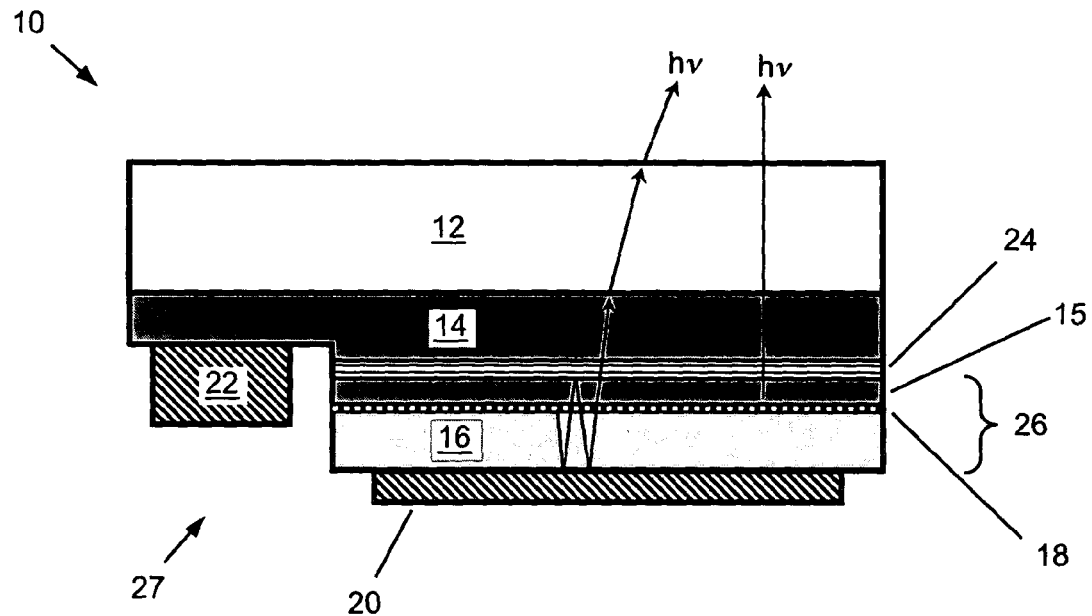
FIG. 3 shows a schematic cross-section view of a first example of a flip-chip LED with a resonant microcavity, according to the present invention.

FIG. 3 shows a schematic cross-section view of a first example of a flip-chip LED with a resonant microcavity, according to the present invention. Flip-chip LED 10 comprises a transparent growth substrate 12 (e.g., sapphire). First n-doped buffer layer 14 (e.g., n-GaN) overlays substrate 12. Partially reflective mirror layer 24 overlays the first n-type buffer layer 14. Second n-doped barrier layer 15 (e.g., n-GaN) overlays partially reflective mirror layer 24. Light emitting active layer 18 overlays second n-doped barrier layer. P-doped barrier layer 16 (e.g., p-GaN) overlays light emitting active layer 18. Light emitting active layer 18 resides in-between second n-doped barrier layer 15 and p-doped barrier layer 16 so that electrons and holes can be injected into the emissive layer for to generate radiative recombination. Highly reflective p-contact pad 20 overlays p-doped barrier layer 16. N-contact pad 22 overlays first n-doped buffer layer 14, and is disposed within trench 27.

Optically resonant microcavity 26 comprises the volume bounded by partially reflective mirror layer 24 at the front (upper) end of microcavity 26, and by highly reflective p-contact pad 20 at the rear (lower) end of microcavity 26. Partially reflective mirror layer 24 is partially reflecting (i.e., semi-transparent), and can have a reflectivity as low as 25–50%. Mirror layer 24 may comprise a distributed Bragg reflector (DBR). Highly reflective p-contact pad 20 can have a high reflectivity (e.g., >70%), depending on the choice of contact material (e.g., metal or metal alloy). Light (hv) emitted upwards from light emitting layer 18 towards mirror layer 24 can pass through the partially reflective mirror layer and escape through transparent growth substrate 12. Alternatively, light (hv) emitted downwards from light emitting layer 18 reflects from highly reflective p-contact pad 20 back towards mirror layer 24, where it can be trapped and enhanced within resonant microcavity 26, or, alternatively, pass through mirror layer 24 and escape. The use of a Fabry-Perot resonant microcavity 26 formed by the two mirror layers 20 and 24 results in optical spontaneous light emission from the active region, which is restricted to the modes of the cavity. The two mirrors of the resonant cavity reduce the isotropic emission of light, and improve the light emission characteristics in terms of a more directed (anisotropic) emission.

Transparent growth substrate 12 can be made of sapphire, glass, GaN, AlN, ZnO, GaP, GaAs, InP, GaAsP, ZnSe, ZnS, ZnSSe, SiC, a spinel material, and combinations thereof; and can have a thickness of about 100 microns to about 1000 microns.

First n-doped buffer layer 14 can be made of n-doped GaN and is generally relatively thick (>1 micron) to act as a buffer layer by reducing the impact of crystallographic defects arising at the substrate-layer (12 to 14) interface.

Second n-doped barrier layer 15 can be made of n-doped GaN or n-doped AlGaN. The second layer's thickness can be optimized in conjunction with the other layers in the optical cavity for maximum efficiency. Second n-doped barrier layer 15 can act as a barrier for confining electrons and holes in the active/emissive layer 18 for obtaining higher conversion efficiency.

P-doped barrier layer 16 can be made of p-doped GaN or p-doped AlGaN. This layer's thickness can be optimized in conjunction with the other layers in the optical cavity for maximum efficiency.

Light emitting active layer 18 (i.e., emissive or active layer 18) can comprise a homostructure, single heterostructure (SH), double heterostructure (DH), a quantum well (QW), or a multiple quantum well (MQW). Emissive layer 18 may comprise InGaN, which emit in the visible portion of the spectrum. Alternatively, emissive layer 18 may comprise the quarternary compound AlInGaN, due to the additional degree of freedom provided by adding Indium (i.e., providing a greater range of available bandgaps and lattice constants). AlInGaN LEDs generally use (multiple) quantum well structures consisting of a very thin (<few nanometers) AlInGaN layer between thin AlInGaN layers with a wider bandgap to provide quantum confinement of carriers in the well. The quantum well provides higher efficiency for emission of photons from injected carriers. Alternatively, light emitting active layer 18 can comprise an InGaAsP/InGaAs multiple quantum well. Alternatively, emissive layer 18 may comprise GaN, AlGaN, or AlInGaN for the active layer, which may produce deeper UV light emission.

Highly reflective p-contact pad 20 serves both as an Ohmic contact (which needs low resistance) and as an optical reflector (e.g., in the wavelength range 380–450 nm for some LED's), and needs to have good adhesion to p-doped barrier layer 16. Highly reflective p-contact pad 20 can be made of an electrically conductive metal or metal alloy, including, but not limited to: silver, nickel, aluminum, palladium, platinum, rhodium, molybdenum, titanium, gold, copper, and combinations thereof. Palladium, platinum, and/or titanium can be used as a thin adhesion layer to improve bonding of a thicker metallic layer (e.g., Ag, Al) to the p-doped barrier layer 16. Diffusion barrier coatings (e.g., Pt, Mo, Ni) may be used to control unwanted diffusion of materials across boundaries during annealing or other heat-treating steps. Highly reflective p-contact pad 20 can have a thickness of about 100 nm to several microns. There may be some engineering compromise between achieving high optical reflectivity and low electrical contact resistance, however.

Alternatively, highly reflective p-contact pad 20 may comprise a reflective multi-layer metal stack. The stack may comprise a triple-layer reflective stack, comprising an adhesion-promoting layer/a high reflectivity layer/a protective coating to prevent oxidation.

Some examples of triple-layer reflective metal stacks, according to the present invention, include: Pd/Al/Au and Pd/Ag/Au. The first material Pd (or Ti or Pt) is used as an adhesion-promoting layer, and contributes some of the reflectivity. The second layer (e.g., Al or Ag) also serves as a reflecting layer. The third layer (e.g., Au) serves as a protective coating to prevent unwanted oxidation of the second layer, since Ag and Al can readily be oxidized. We have made measurements of the reflectivity of three specific reflective metals stacks over a range of wavelengths from 350 nm to 500 nm. The first stack comprises 10 nm Pd/ 200 nm Au, and has a reflectivity of about 34%. The second stack comprises 2.5 nm Pd/ 200 nm Ag/300 nm Au, and has a reflectivity of from about 62% at 350 nm to about 80% at 500 nm. The third stack comprises 2.5 nm Pd/200 nm Al/300 nm Au, and has a reflectivity of from about 66% at 350 nm to about 72% at 500 nm.

Alternatively, highly reflective p-contact pad 20 may comprise a four-layer reflective stack, comprising an adhesion-promoting layer/a high reflectivity layer/a diffusion barrier/ a protective coating to prevent oxidation. The diffusion barrier layer may comprise Pt, Mo, Rh, or Ni, and combinations thereof. A diffusion barrier of molybdenum and/or rhodium may also provide a high reflectivity, possibly eliminating the need for Ag or Al as the reflecting layer.

We have determined using a simple analytical model that the optimum relationship between the reflectivity, $R_{rear}$ of p-contact pad 20 (i.e., rear surface) and the reflectivity, $R_{front}$, of partially reflecting mirror layer 24 (i.e., front surface), follows a simple relationship that provides for the optimum light extraction efficiency from resonant microcavity 26. Assuming simple scalar reflectances and a $\lambda/2$ cavity, then this optimum relationship (i.e., for producing the maximum light extraction efficiency) is given by:

$$R_{front} = 0.5 \, R_{rear} \qquad (1)$$

The net light extraction efficiency depends upon the reflectivities of the front and rear mirrors, the refractive index of the cavity 26, the refractive index of the cavity 26, and the optical thickness of the cavity 26. For a cavity composed primarily of GaN with a refractive index around 2.5, the optimum light extraction efficiencies may range from about 21% to about 31%, according to eq. (1).

Materials that may be used for n-contact pad 22 include, for example, Ti, Al, Ni, and Mo, or combinations thereof. Alternatively, a multi-layer metal stack may be used for n-contact pad 22, e.g., Ti/Al/Au or Ti/Al/Mo/Au.

Distributed AlGaN/GaN DBR's with a high reflectivity (>90%) and high electrical conductivity are very difficult to grow due to the lattice mismatch between AlGaN and GaN, to the small difference in refractive indices between AlGaN and GaN, and to the difficulty of doping AlGaN alloys. A high-reflectivity AlGaN/GaN DBR may require sixty alternating layers of AlGaN and GaN, which is very difficult to grow. The p-type AlGaN alloy is particularly difficult to dope. However, since the lower mirror 20 in microcavity 26 of the present invention can comprise a single layer of a naturally reflective metal or metal alloy, then there is no need to fabricate a complex and expensive DBR having a high reflectivity.

Partially reflective mirror layer 24 functions as the upper mirror of microcavity 26, and can comprise a DBR that comprises a stack of alternating semiconductor materials with different refractive indices and quarter-wavelength thickness, e.g., alternating layers of AlGaN and GaN. Since high reflectivity is not required for the upper mirror 24, a lower number of alternating layers in the DBR stack can be used. For example, a reflectivity 50% may require only 10 to 20 layers, while a reflectivity of 25% would require even fewer layers. Also, DBR layer 24 can comprise n-type material that might be easier to dope and make electrically conductive. For example, high electron concentrations have been achieved in AlGaN alloys with Al contents as high as 40%.

The total optical thickness of resonant microcavity 26 (i.e., cavity 26) includes the physical thickness of the layers (15, 16, and 18) multiplied by the refractive indices of the layers, and includes the optical phase change at the mirrors (20 and 24). The total optical thickness of the cavity is selected to be a multiple of the resonant wavelength $m\lambda/2$, where m is an integer and $\lambda$ is the wavelength. The cavity order m can be small (e.g., less than 4) for high extraction efficiency. In addition, the thicknesses of layers 15 and 18 can be selected so that emissive/active layer 18 is located at an anti-node of the cavity for maximum efficiency. For a flip-chip LED design having a cavity order of 2 (i.e., m=2), GaN for the intra-cavity barrier layers (15 and 16), a silver reflector (20), and a ten-layer DBR (24), the optimum thicknesses for barrier layers 15 and 16 will be about 73 nm and about 91 nm, respectively. People familiar with the art will understand how optimum layer thicknesses change with different resonant wavelengths, cavity orders, reflector properties, and refractive indices for the intra-cavity layers.

Figure 4:
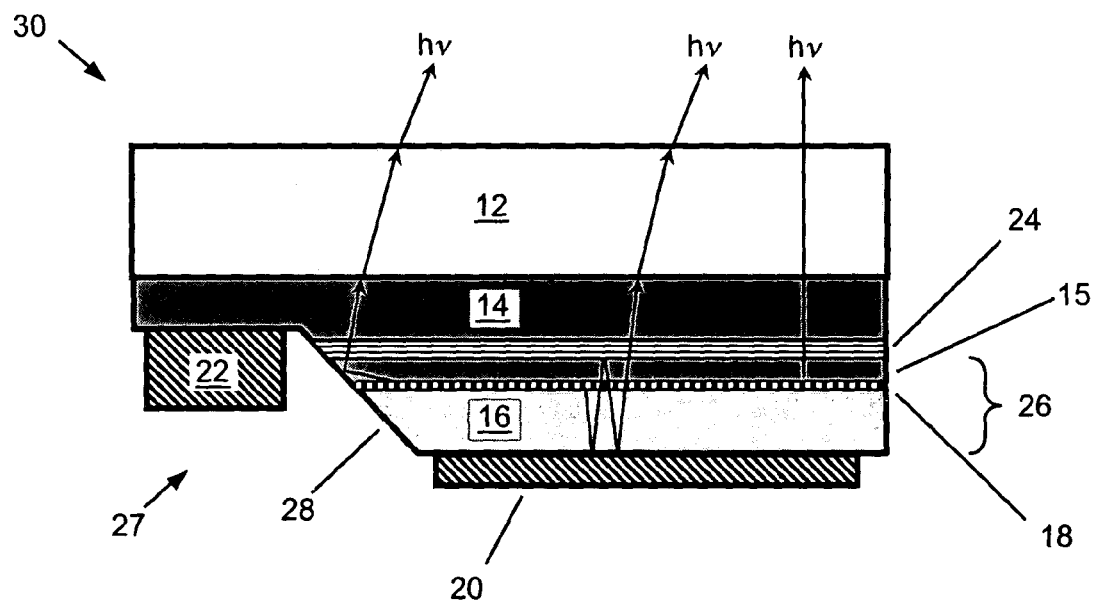
FIG. 4 shows a schematic cross-section view of a second example of a flip-chip LED with a resonant microcavity and sloped sidewall, according to the present invention.

FIG. 4 shows a schematic cross-section view of a second example of a flip-chip LED with a resonant microcavity and sloped sidewall, according to the present invention. This embodiment comprises the same features as the example illustrated in FIG. 3, except that sidewall 28 is sloped at an angle. Light emitted from light emitting layer 18 that is not emitted into the extracted vertical modes is emitted into the waveguided lateral modes. Some of this light can be extracted by sloping the sidewalls 28 of the trench for the n-type contact 22. Such sloped sidewalls can be achieved, for example, during a contact etch. The angle of inclination of sloped sidewall 28 can be any angle that provides a substantial amount of internal reflection of laterally-waveguided light upwards towards the transparent growth substrate 12. Alternatively, this angle may be about 45 degrees, as illustrated in FIG. 4.

Table 1 summarizes examples of different combinations of materials that can be used for the flip-chip LED with resonant microcavity of the present invention. Depending on the specific choice of materials, these embodiments produce light over a wide range of light emission wavelengths, i.e. from deep-UV to IR.

TABLE 1

| Layer | Layer No. | Deep-UV | Violet to Green | Red to Orange | Near-IR | IR |
|---|---|---|---|---|---|---|
| Substrate | 12 | Sapphire, SiC, ZnO, GaN, AlN | Sapphire, SiC, ZnO, GaN, AlN | GaAs | GaAs | InP |
| Buffer | 14 | (Al,In)GaN | GaN | GaAs | GaAs | InP |
| DBR | 24 | AlGaN/AlGaN | AlGaN/GaN | AlGaAs/GaAs | AlGaAs/GaAs | InGaAsP |
| Barrier | 15 | AlGaN | AlGaN | AlGaInP | (Al)GaAs | InGaAsP |
| Active | 18 | (Al,In)GaN MQW | InGaN MQW | AlGaInP DH | InGaAs MQW | InGaAsP MQW or DH |
| Barrier | 16 | (Al,In)GaN | AlGaN | AlGaInP | (Al)GaAs | InGaAsP |

The particular examples discussed above are cited to illustrate particular embodiments of the invention. Other applications and embodiments of the apparatus and method of the present invention will become evident to those skilled in the art. It is to be understood that the invention is not limited in its application to the details of construction, materials used, and the arrangements of components set forth in the following description or illustrated in the drawings.

The scope of the invention is defined by the claims appended hereto.

What is claimed is:

1. A flip-chip light emitting diode with enhanced light extraction efficiency, comprising:
    a transparent growth substrate;
    a first n-type buffer layer overlaying the transparent growth substrate;
    a partially reflective mirror layer overlaying the first n-type buffer layer;
    a second n-type barrier layer overlaying the partially reflective mirror layer;
    a light emitting active layer overlaying the second n-type barrier layer;
    a p-type barrier layer overlaying the light emitting active layer;
    a highly reflective p-contact pad overlaying the p-type barrier layer; and
    an n-contact pad overlaying the first n-type buffer layer;
    wherein the n-contact pad and the highly reflective p-contact pad are disposed on the same side of the light emitting diode;
    wherein a resonant optical microcavity is disposed in-between the partially reflective mirror layer and the highly reflective p-contact pad;
    wherein the highly reflective p-contact pad comprises a reflective metal stack comprising:
        an adhesion layer, in direct contact with the p-type barrier layer, consisting of Pd or Ti or a combination of Pd and Ti;
        a reflective layer, in direct contact with the adhesion layer, comprising at least one metal selected from the group consisting of Al and Ag; and
        a protective coating layer, covering said reflective layer, comprising Au;
    wherein the P-doped barrier layer comprises p-doped GaN or p-doped AlGaN;
    wherein the partially reflective mirror layer comprises a distributed Bragg reflector;
    wherein the distributed Bragg reflector comprises alternating layers of AlGaN and GaN; and
    wherein the distributed Bragg reflector has a reflectivity equal to approximately 25% to 40%.

2. The flip-chip light emitting diode of claim 1, wherein the transparent growth substrate comprises one or more materials selected from the group consisting of sapphire, glass, GaP, GaAs, InP, GaAsP, ZnSe, ZnS, ZnSSe, SiC, GaN, AlN, ZnO, a spinel material, and combinations thereof.

3. The flip-chip light emitting diode of claim 1, wherein the first n-type buffer layer and the second n-type barrier layer comprise n-doped GaN.

4. The flip-chip light emitting diode of claim 1, wherein the light emitting active layer comprises one or more structures selected from the group consisting of a homostructure, single heterostructure (SH), double heterostructure (DH), a quantum well (QW) and a multiple quantum well (MQW).

5. The flip-chip light emitting diode of claim 1, wherein the n-contact pad is disposed within a trench, and further wherein a sidewall of the trench is sloped at an angle, wherein light emitted as waveguided lateral modes is internally reflected off the sloped sidewall and redirected towards the transparent growth substrate.

6. The flip-chip light emitting diode of claim 5, wherein the angle of the sloped sidewall is about 45 degrees.

7. The flip-chip light emitting diode of claim 1, wherein the highly reflective p-contact pad has a reflectivity greater than or equal to about 70%.

8. The flip-chip light emitting diode of claim 1, wherein the optical length, L, of the resonant optical microcavity is a low integer multiple of $\lambda/2$, so that $L=m\lambda/2$; wherein m is an integer from 1 to 4, and $\lambda$ is the wavelength of the spontaneous emission from the light emitting active layer.

9. The flip-chip light emitting diode of claim 1, wherein the reflective metal stack comprises about 2.5 nm Pd/200 nm Ag/300 nm Au.

10. The flip-chip light emitting diode of claim 1, wherein the light emitting active layer is disposed at an anti-node of the resonant optical microcavity.

11. The flip-chip light emitting diode of claim 1, wherein the light emitting active layer comprises one or more of the group consisting of (Al,In)GaN MQW, InGaN MQW, AlGaInP DH, InGaAs MQW, InGaAsP MQW, and InGaAsP DH.

12. The flip-chip light emitting diode of claim 1, wherein the light emitting active layer is disposed at an anti-node of said microcavity.

13. The flip-chip light emitting diode of claim 1, wherein the the highly reflective p-contact pad further comprises a diffusion barrier layer disposed in-between the reflective layer and the protective coating layer; and wherein the diffusion barrier layer comprises at least one metal selected from the group consisting of Pt, Mo, Rh and Ni.

14. The flip-chip light emitting diode of claim 1, wherein the distributed Bragg reflector comprising less than 20 alternating layers of AlGaN and GaN.

* * * * *